(12) United States Patent
Kernander et al.

(10) Patent No.: US 6,319,596 B1
(45) Date of Patent: Nov. 20, 2001

(54) BARRIER LAMINATE

(75) Inventors: Carl P. Kernander, Northwood, NH (US); Robert F. Davis, Wilmington, DE (US)

(73) Assignee: Madico, Inc., Woburn, MA (US)

( * ) Notice: Subject to any disclaimer, the term of this patent is extended or adjusted under 35 U.S.C. 154(b) by 0 days.

(21) Appl. No.: 09/325,234

(22) Filed: Jun. 3, 1999

(51) Int. Cl.$^7$ .......................... B32B 27/08; B32B 27/30; B32B 27/32; B32B 27/36

(52) U.S. Cl. .................. 428/215; 428/216; 428/219; 428/340; 428/421; 428/422; 428/480; 428/483; 428/515; 428/516; 428/518; 428/520; 428/523; 136/243; 136/244; 136/256

(58) Field of Search ................... 428/1.6, 213, 215, 428/216, 219, 340, 421, 422, 483, 480, 515, 516, 518, 520, 522, 523; 136/243, 244, 256

(56) References Cited

U.S. PATENT DOCUMENTS

| | | | |
|---|---|---|---|
| 4,095,760 | * | 6/1978 | Sommer et al. ............... 244/123 |
| 4,442,162 | * | 4/1984 | Kuester .......................... 428/245 |
| 4,659,625 | * | 4/1987 | Decroly et al. ................ 428/412 |

FOREIGN PATENT DOCUMENTS

WO 93/06159 * 4/1993 (WO).

OTHER PUBLICATIONS

Whelan, Tony, Polymer Technology Dictionary, pp. 137, 340–341, 1994.*

* cited by examiner

*Primary Examiner*—Vivian Chen
(74) *Attorney, Agent, or Firm*—Huntley & Associates

(57) ABSTRACT

Laminates of having a first outer layer of polyvinyl fluoride, at least one mid layer, and a second outer layer of polyvinyl fluoride, ethylene vinyl acetate or polyolefin with a surface of ionomer. The laminates are particularly useful for protecting photovoltaic cells, solar panels, and circuit boards.

28 Claims, 2 Drawing Sheets

PVF—

—Adhesive

LCP—

—Adhesive

EVA—

BARRIER LAMINATE

BACKGROUND OF THE INVENTION

The present invention relates to laminates, and more particularly to thin film laminates. Thin film laminates are useful in many applications, particularly where the properties of one layer of the laminate complement the properties of another layer, providing the laminate with properties or qualities that cannot be obtained in a single layer film. Previous laminates provided only one of the two qualities desirable for laminates for use in electronic devices. A need remains for a laminate that provides an effective barrier to moisture while also providing low dielectric strength.

With the advent of sophisticated equipment in the electrical and electronic fields, it has become necessary that the components of the various pieces of equipment be protected from the effects of moisture and the like. For example, photovoltaic cells and solar panels comprising photovoltaic cells must be protected from the elements, especially moisture, which can negatively impact the function of the cells. In addition, circuit boards used in relatively complicated pieces of equipment such as computers, televisions, radios, telephones, and other electronic devices should be protected from the effects of moisture. Previous solutions to the problem of moisture utilized metal foils as a vapor or moisture barrier. Metal foils, however, must be insulated from the electronic component to avoid interfering with performance. Previous laminates using metal foils typically displayed a higher level of dielectric strength than was desirable, while other laminates using a metal foil layer were also susceptible to other environmental conditions.

SUMMARY OF THE INVENTION

The present invention provides a laminate that can be used in electronic devices such as photovoltaic cells, solar panels and circuit boards that combines a high degree of resistance to the passage of moisture while also providing low dielectric strength. Because it combines such properties, the laminates of the present invention are especially useful in applications where the electronic components are exposed to the elements, such as in a photovoltaic cell in a solar panel, which is exposed to sunlight and usually is used in an outdoor environment. Accordingly, such photovoltaic cells should be protected from moisture and other environmental effects.

Specifically, the present invention provides a laminate comprising (a) a first outer layer of polyvinyl fluoride; (b) at least one mid-layer selected from at least one of the group consisting of (i) poly(chlorotrifluoro ethylene), (ii) polymeric film coated on one or both surfaces with polyvinylidene chloride, (iii) polymeric film coated on one or both surfaces with liquid crystal polymer, and (iv) liquid crystal polymers; and (c) a second outer layer selected from at least one of the group consisting of (i) polyvinyl fluoride, (ii) ethylene vinyl acetate and (iii) polyolefin film with a surface of ionomer resin.

The present invention also provides articles comprising laminates as described above.

DETAILED DESCRIPTION OF THE INVENTION

Figure 1:
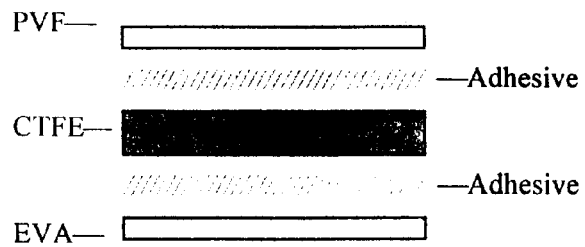
FIG. 1 is a cross sectional illustration of a first embodiment of a laminate of the present invention.

The present invention will be more fully understood by reference to the figures and the following description. The figures and description below pertain to preferred embodiments of the present invention. Variations and modifications of these preferred embodiments and other embodiments within the scope of the invention can be substituted without departing from the principles of the invention, as will be evident to those skilled in the art.

The laminates of the present invention comprise individual layers that can be adhesively bonded together. Other means and methods of forming a laminate from individual layers are known in the art and are within the scope of the invention. The specific means of forming the laminates of the present invention will vary according to the composition of the layers and the desired properties of the resulting laminate, as well as the end use of the laminate.

Preferably, each of the layers is bonded together by applying an adhesive to one layer and attaching another layer, and repeating the process as necessary, depending on the number of layers. Various adhesives can be used to fabricate the laminates of the present invention, including those presently known and used for adhering layers of other laminates together. The particular adhesive that can be used will vary according to the composition of the layers and the intended use of the laminate.

Preferred adhesives include (I) formulations comprising 570 parts by weight of Adcote 76H6 polyester adhesive, 30 parts by weight of Adcote 76H7A polyester adhesive, 100 parts by weight of methylethyl ketone (MEK), and 100 parts by weight of toluene; and (II) formulations comprising 500 parts by weight of Unovers 2620 polyurethane adhesive, 35 parts by weight of Upaco 3590 polyurethane adhesive, 200 parts by weight of MEK, 200 parts by weight of toluene, and 0.22 parts by weight of dibutyltin dilaurate. The above described preferred adhesive formulations are both about 24% non-volatile and are typically coated onto a layer of the laminate at about from 7 to 10 grams per square meter, resulting in a final adhesive layer thickness of about from 0.25 mils to 0.5 mils, depending on the density of the adhesive.

In the broadest sense, fabrication of the laminates of the present invention involves four steps which can be repeated according to the number of layers used to form a desired laminate. Typically, these steps are (1) coating a layer of the laminate with an adhesive, typically dissolved in a solvent carrier; (2) drying the coated layer; (3) conditioning the layer to be laminated to the coated layer; and (4) laminating the coated layer to the conditioned layer. These four steps result in an intermediate laminate, and the thus obtained intermediate laminate is then processed according to the above four steps to obtain a laminate of the present invention. The above process of forming an intermediate laminate that can be used to obtain a laminate of the present invention can be repeated, and the number of times this process is used will vary according to the desired final product. For example, a four layer laminate of the present invention, comprising two mid-layers, can be formed by repeating the above process three times.

The coating step of the process of fabricating laminates of the present invention can vary, including known methods of applying laminating adhesives to films that will form layers of a laminate. The coating can be carried out by any conventional means, such as spray, roll, knife, curtain, or gravure coaters, or any method that permits the application of a uniform coating without streaks or other defects. Variations and modifications to the coating step described herein will be apparent to those skilled in the art, and are within the scope of the present invention. For all laminates of the present invention, the first step is applying an adhesive, preferably of the type and formulation discussed above, to the first outer layer of polyvinyl fluoride (PVF).

Preferably, the adhesive is applied to the first outer layer of PVF rather than the at least one mid-layer, because the PVF is easier to process than most of the possible mid-layers of the present invention. Many of the mid-layers of the present invention, especially those formed from thin sheets of liquid crystal polymer, can be negatively affected by repeated processing through the rollers used to manipulate the layer and allow application of the adhesive, and by the tension forces that result from such processing. In addition, in the fabrication of laminates having a second outer layer of EVA, which can be affected by the solvent used to apply the adhesive, the adhesive should be applied to the PVF layer face of the intermediate laminate. Accordingly, because the first outer layer of PVF is stronger, more durable, and more resistant to processing than any of the possible mid-layers, it is preferred that this layer be processed first.

According to the first step of the process of fabricating a laminate of the present invention, a preferred adhesive of either formulation I or II described above is applied to the first outer layer of PVF using either a comma coater or a roll applicator with a Mayer Rod metering system. The adhesive is generally controlled to 7 to 10 grams per square meter dry. The adhesive is applied in liquid form, usually carried in a solvent. The solvents that can be used in fabricating laminates of the present invention include most organic solvents. Of these, MEK and toluene are preferred.

After applying a laminating adhesive to the first outer layer as described above, the coated first outer layer is dried, then passed through a multi zone oven to evaporate solvents from the coating. One possible set of oven settings for this step of the fabrication process can be: Zone 1=120° F., Zone 2=140° F., and Zone 3=175° F. These settings are typical for this phase of fabrication, especially when the desired laminate comprises the component Example 1 below. The drying step can also occur as the coated layer is passed around heated rollers.

The drying step is typically followed by conditioning the film or layer to be laminated to the first outer layer. It is preferred that the film or layer to be laminated be conditioned while the first outer layer is being dried. If there is an inconsistency in the film thickness, the film can be heated by a series of hot rollers in order to smooth it and remove any defects, equalize any variations in thickness or formation, and otherwise improve the quality and consistency of the film.

Additional conditioning can include corona treatment according to any known process. Corona treatment of the film to be laminated is preferred for CTFE and LCP mid-layer films, because this process places additional oxygen on the surface of the film and increases surface energy to improve the bond of the laminating adhesive, and thus improve the bond of the at least one mid-layer to the first outer layer of PVF.

After the coated first outer layer of PVF has been dried, and the at least one mid-layer has been conditioned, the two layers are laminated. According to this process step, the two films are fed into a laminating nip. Typically, a laminating nip comprises a heated chrome roll and a rubber backing roll between which lamination takes place. Typical laminating temperatures can be 250–350° F., but can vary according to factors such as the desired laminate, the adhesive used, and other factors which will be evident to those skilled in the art. The laminating roll pressure, which also depends on similar variables, including the particular films used and their thicknesses, can vary about from 50 psi to 250 psi. After the layers have been laminated, the resulting intermediate laminate should be cured and can be wound for storage and in preparation for being reprocessed. The curing time and conditions will also vary according to many factors, including the thickness of the layers and resulting laminate, the composition of the films used to obtain the laminate, the adhesive used to bond the layers, and the environment in which the intermediate laminate is cured.

Subsequent laminations to form a laminate of the present invention are performed in the same manner as described above. In embodiments where the second outer layer is formed from EVA, the coating process involves coating the intermediate laminate rather than the EVA layer, because the EVA layer can be affected by the solvents that carry the adhesive. Accordingly, in such embodiments of a laminate of the present invention, it is also preferred that the adhesive be applied to the PVF side of the intermediate layer.

Line speeds for the above process will depend on the processing machinery used, as well as the characteristics of the films used to obtain the laminate. Typical line speeds for the type of lamination process described above can be about 100–120 feet per minute, with a dwell time of about 45 seconds. The dwell time can include the time spent in the multi zone oven, and at other stages in the fabrication process.

The laminates of the present invention can be formed in any dimensions, depending on the parameters of the processing equipment and the availability and cost of component film layers having the desired dimensions. Typically, the laminates of the present invention are about from 24 to 100 inches wide. In photovoltaic applications, the desired width is about from 50 to 60 inches, however, the width will typically be that which can be used most efficiently. For example, if there is a demand for laminate having a width of 29 inches, a laminate having a width of 50 inches would result in unnecessary waste, and a 60 inch wide laminate would provide the most efficient dimensions.

The laminates of the present invention can be used in various electronic applications, most notably, as a means of sealing photovoltaic cells and protecting them from the effects of moisture, while also solving the problems associated with previously used barrier laminates comprising a metallic film moisture barrier layer. The laminates of the present invention are resistant to breakdown effects associated with exposure to enviromental conditions, including UV and other bands of sunlight, heat, moisture, and electrical forces.

According to the above general process parameters, a wide variety of laminates of the present invention can be fabricated. The following Examples illustrate several possible embodiments of the laminates of the present invention. For the sake of brevity and clarity, these embodiments are limited to three layer laminates, however, the invention is not limited to such laminates, and it will be clear to those skilled in the art how to repeat the fabrication process to obtain laminates of the present invention having more than three layers.

EXAMPLE 1

A laminate of the present invention is prepared having a first outer layer of PVF having a thickness of 22.5 micrometers. An adhesive of formulation I described above is applied to the first outer layer of PVF using a comma coater. The adhesive is controlled to 9 grams per square meter dry. The coated first outer layer is then dried to remove the solvent. A layer of CTFE having a thickness of 25 micrometers is then laminated to the PVF. The resulting intermediate laminate is then reprocessed according to the above and laminated to a second outer layer of EVA having a thickness of 100 micrometers to obtain a laminate of the present invention. A cross section of the laminate of Example 1 is shown in FIG. 1.

EXAMPLE 2

Figure 2:
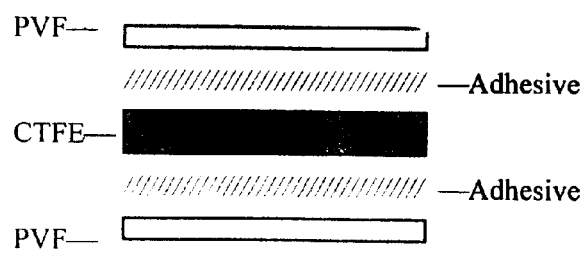
FIG. 2 is a cross sectional illustration of a second embodiment of a laminate of the present invention.

A laminate of the present invention is prepared according to the general procedure of Example 1, but having a first outer layer of PVF having a thickness of 37 micrometers. An adhesive of formulation II described above is applied using a Mayer rod coating, to the first outer layer of PVF as described above, wherein the adhesive is controlled to 9 grams per square meter dry. The coated and dried outer layer of PVF is then laminated to a mid-layer of CTFE having a thickness of 50 micrometers, and the resulting intermediate laminate is reprocessed as detailed above and laminated to a second outer layer of PVF having a thickness of 37 micrometers. A cross section of the laminate of Example 2 is shown in FIG. 2.

EXAMPLE 3

Figure 3:
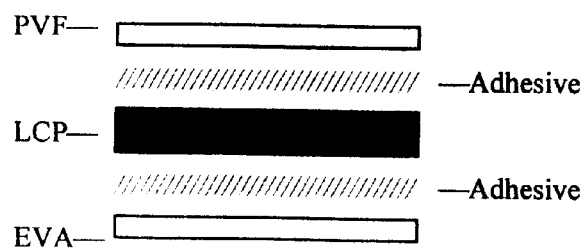
FIG. 3 is a cross sectional illustration of a third embodiment of a laminate of the present invention.

A laminate of the present invention is prepared according to the general procedure of Example 1, but having a first outer layer of PVF having a thickness of 37 micrometers, a mid-layer of LCP having a thickness of 25 micrometers, and a second outer layer of EVA having a thickness of 100 micrometers. The layers were adhesively bonded together using nine grams per square meter of adhesive for each layer of the lamination, and according to the general process described above. A cross section of the laminate of Example 3 is shown in FIG. 3.

EXAMPLE 4

Figure 4:
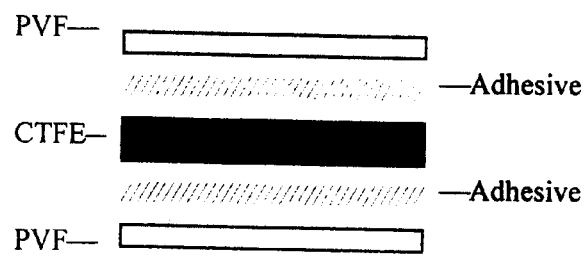
FIG. 4 is a cross sectional illustration of a fourth embodiment of a laminate of the present invention.

A laminate of the present invention is prepared according to the general procedure of Example 1, but having a first outer layer of PVF having a thickness of 37 micrometers, a mid-layer of LCP having a thickness of 50 micrometers, and a second outer layer of PVF having a thickness of 25 micrometers. Nine grams per square meter of adhesive were used in forming the laminate of Example 4 according to the general process described above. A cross section of the laminate of Example 4 is shown in FIG. 4.

EXAMPLE 5

Figure 5:
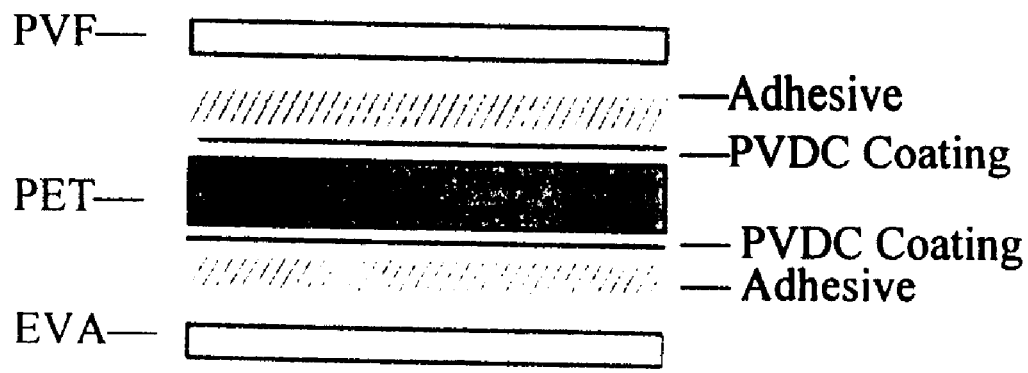
FIG. 5 is a cross sectional illustration of a fifth embodiment of a laminate of the present invention.

A laminate of the present invention is prepared according to the general procedure of Example 1, but having a first outer layer of PVF having a thickness of 37 micrometers, a mid-layer of PET having a thickness of 50 micrometers, wherein the mid-layer of PET is coated on both sides with 5 grams per square meter of PVDC, and a second outer layer of EVA having a thickness of 100 micrometers. Nine grams per square meter of adhesive were used in obtaining the laminate of Example 5 according to the general process described above. A cross section of the laminate of Example 5 is shown in FIG. 5.

EXAMPLE 6

Figure 6:
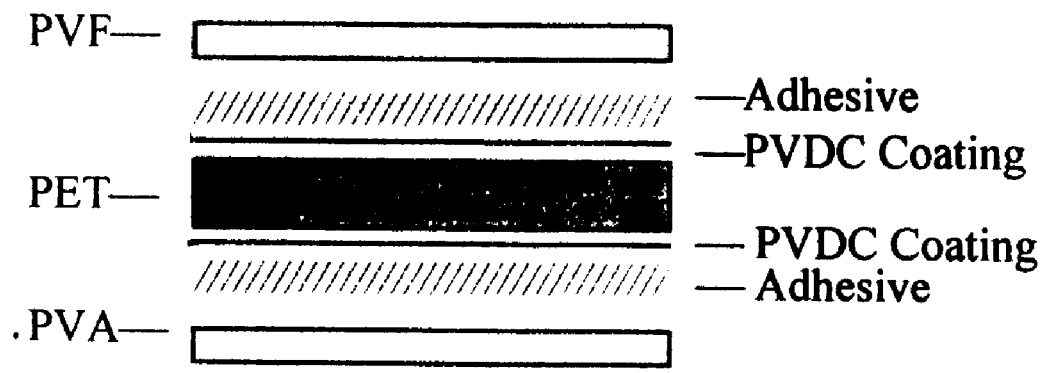
FIG. 6 is a cross sectional illustration of a sixth embodiment of a laminate of the present invention.

A laminate of the present invention is prepared according to the general procedure of Example 1, but having a first outer layer of PVF having a thickness of 37 micrometers, a mid-layer of PET having a thickness of 50 micrometers, wherein the mid-layer of PET is coated on both sides with 10 grams per square meter of PVDC, and a second outer layer of PVF having a thickness of 25 micrometers. Nine grams per square meter of adhesive were used in obtaining the laminate of Example 6 according to the general process described above. A cross section of the laminate of Example 6 is shown in FIG. 6.

We claim:

1. A laminate consisting essentially of
   (a) a first outer layer of polyvinyl fluoride film;
   (b) at least one mid-layer selected from at least one of the group consisting of (i) polymeric film coated on one or both surfaces with polyvinylidene chloride, and (ii) liquid crystal polymers; and
   (c) a second outer layer selected from at least one film of the group consisting of (i) polyvinyl fluoride; (ii) ethylene vinyl acetate, and (iii) polyolefin film with a surface of ionomer resin.

2. A laminate of claim 1 wherein the first outer layer, at least one mid layer, and second outer layer are bonded together.

3. A laminate of claim 2 wherein the layers are cohesively bonded.

4. A laminate of claim 2 wherein the layers are adhesively bonded.

5. A laminate of claim 1 wherein at least one of the outer layers is adhesively bonded to at least one middle layer.

6. A laminate of claim 1 wherein the first outer layer has a thickness of about from 15 to 50 microns.

7. A laminate of claim 6 wherein the first outer layer has an optical density of at least about 1.0.

8. A laminate of claim 6 wherein the first outer layer has a thickness of about from 25 to 38 microns.

9. A laminate of claim 1 wherein the at least one mid-layer has a thickness of about from 10 to 50 microns.

10. A laminate of claim 9 wherein the at least one mid layer has a thickness of about 24 microns.

11. A laminate of claim 1 wherein the at least one mid layer consists essentially of polyester coated with about from 2 to 20 grams per square meter of a polyvinylidene chloride formulation.

12. A laminate of claim 11 wherein the thickness of the polyvinylidene chloride coating formulation has a thickness of about 2 to 15 microns.

13. A laminate of claim 1 wherein the second outer layer consists essentially of polyvinyl fluoride having a thickness of about from 14 to 50 microns.

14. A laminate of claim 1 wherein the second outer layer consists essentially of ethylene vinyl acetate having a thickness of about from 50 to 200 microns.

15. A laminate of claim 1 wherein the second outer layer consists essentially of ethylene vinyl acetate.

16. A laminate of claim 15 wherein the ethylene vinyl acetate comprises about from 2 to 33 percent by weight of vinyl acetate.

17. A laminate of claim 16 wherein the ethylene vinyl acetate comprises about from 2 to 8 percent by weight of vinyl acetate.

18. A laminate of claim 1 further comprising at least one heat sealable layer bonded to the second outer layer.

19. A laminate of claim 1 wherein the first outer layer is visibly transparent but substantially opaque to ultraviolet light.

20. A laminate of claim 19 wherein the first outer layer is a film that is at least about 99% opaque to ultraviolet light.

21. A laminate of claim 1 wherein the middle layer consists essentially of polyester film coated on one or both surfaces with liquid crystal polymer.

22. A laminate of claim 1 wherein the middle layer consists essentially of liquid crystal polymer.

23. A laminate of claim 1 wherein the second outer layer consists essentially of polyvinyl fluoride.

24. A laminate of claim 1 wherein the second outer layer consists essentially of polyolefin film with a surface of ionomer resin.

25. A laminate consisting essentially of
    (a) a first layer of polyvinyl fluoride film;
    (b) at least one mid-layer film consisting essentially of at least one liquid crystal polymer; and
    (c) a second outer layer selected from at least one film of the group consisting of (i) polyvinyl fluoride; (ii) ethylene vinyl acetate; and (iii) polyolefin film with a surface of ionomer resin.

26. A laminate of claim 25 wherein the layer of liquid crystal polymer has a thickness of about from 12 to 50 microns.

27. A solar panel comprising a plurality of photovoltaic cells and a laminate comprising
    (a) a first outer layer of polyvinyl fluoride;
    (b) at least one mid-layer selected from at least one of the group consisting of (i) poly(chlorotrifluoro ethylene), (ii) polymeric film coated on one or both surfaces with polyvinylidene chloride, (iii) polymeric film coated on one or both surfaces with liquid crystal polymer, and (iv) liquid crystal polymers; and
    (c) a second outer layer selected from at least one of the group consisting of (i) polyvinyl fluoride; (ii) ethylene vinyl acetate, and (iii) polyolefin film with a surface of ionomer resin.

28. A solar panel of claim 27 wherein the middle layer consists essentially of poly(chlorotrifluoro ethylene).

* * * * *